(12) United States Patent
Nagatomi et al.

(10) Patent No.: US 7,514,860 B2
(45) Date of Patent: Apr. 7, 2009

(54) PHOSPHOR MIXTURE AND LIGHT EMITTING DEVICE

(75) Inventors: Akira Nagatomi, Tokyo (JP); Masahiro Gotoh, Tokyo (JP); Kenji Sakane, Tokyo (JP)

(73) Assignees: DOWA Electronics Materials Co., Ltd., Tokyo (JP); Nichia Corporation, Tokushima (JP)

( * ) Notice: Subject to any disclaimer, the term of this patent is extended or adjusted under 35 U.S.C. 154(b) by 422 days.

(21) Appl. No.: 11/061,669

(22) Filed: Feb. 22, 2005

(65) Prior Publication Data

US 2006/0091790 A1   May 4, 2006

(30) Foreign Application Priority Data

Oct. 28, 2004   (JP) .............................. 2004-314199

(51) Int. Cl.
  *H01J 1/62* (2006.01)
(52) U.S. Cl. .................. 313/503; 313/498; 313/487
(58) Field of Classification Search ................. 313/503, 313/512, 487, 498; 252/301.4, 301.5, 301.6, 252/301.4 F, 301.6 F; 428/690
  See application file for complete search history.

(56) References Cited

U.S. PATENT DOCUMENTS

| 18,985 | A | 12/1857 | Olds |
| 2,121,275 | A | 6/1938 | Zober et al. |
| 3,527,595 | A | 9/1970 | Adler et al. |

(Continued)

FOREIGN PATENT DOCUMENTS

EP   0 459 156 A2   4/1991

(Continued)

OTHER PUBLICATIONS

K. Uheda et al., "The Crystal Structure and Photoluminescence Properties of a New Red Phosphor, Calcium Aluminum Silicon Nitride Doped With Divalent Euroium," Abs. 2073, 206th Meeting., Oct. 3, 2004.

(Continued)

*Primary Examiner*—Joseph L. Williams
*Assistant Examiner*—Elmito Breval
(74) *Attorney, Agent, or Firm*—Oliff & Berridge PLC

(57) ABSTRACT

To provide a light emitting device having a phosphor mixture and a light emitting part, the phosphor mixture including a red phosphor and more than one kind of phosphor having an emission spectrum with a peak in a wavelength range from 500 nm to 630 nm, and emitting light having a sufficient luminance and excellent in color rendering properties not only in a white light with high correlated color temperature, but also in a warm white light with low correlated color temperature. $CaAlSiN_3$:Eu manufactured as a red phosphor and and $CaAl_2Si_4N_8$:Eu manufactured as an orange phosphor, and for example, commercial YAG:Ce as a yellow-green phosphor, are prepared, and emission spectra of these phosphors are measured when excited by excitation light in the wavelength range from 430 nm to 500 nm. Further, the emission spectrum of the light used as an excitation light are measured, by simulation using their emission spectra, a mixing ratio of each phosphor, by which the correlated color temperature of the phosphor mixture becomes a target color temperature, is obtained. And based on the result of the simulation, each phosphor is measured and mixed, thus obtaining the phosphor mixture.

19 Claims, 4 Drawing Sheets

U.S. PATENT DOCUMENTS

| | | | |
|---|---|---|---|
| 3,697,301 A | 10/1972 | Donofrio et al. | |
| 4,477,689 A | 10/1984 | Ogasahara et al. | |
| 4,576,736 A | 3/1986 | Harmuth | |
| 5,398,398 A | 3/1995 | Williams et al. | |
| 5,447,291 A | 9/1995 | Sandhage | |
| 5,600,202 A | 2/1997 | Yamada et al. | |
| 6,180,029 B1 | 1/2001 | Hampden-Smith et al. | |
| 6,504,297 B1 | 1/2003 | Heo et al. | |
| 6,670,748 B2 | 12/2003 | Ellens et al. | |
| 7,138,756 B2 | 11/2006 | Gotoh et al. | |
| 2002/0043926 A1 | 4/2002 | Takahashi et al. | |
| 2003/0030038 A1 | 2/2003 | Mitomo et al. | |
| 2003/0030368 A1* | 2/2003 | Ellens et al. | 313/503 |
| 2003/0094893 A1 | 5/2003 | Ellens et al. | |
| 2003/0132422 A1* | 7/2003 | Tian et al. | 252/301.4 S |
| 2003/0152804 A1* | 8/2003 | Miura et al. | 428/690 |
| 2003/0213611 A1 | 11/2003 | Morita | |
| 2004/0155225 A1 | 8/2004 | Yamada et al. | |
| 2004/0263074 A1* | 12/2004 | Baroky et al. | 313/512 |
| 2005/0001225 A1 | 1/2005 | Yoshimura et al. | |
| 2005/0189863 A1 | 9/2005 | Nagatomi et al. | |
| 2005/0203845 A1 | 9/2005 | Yoshimine et al. | |
| 2005/0205845 A1 | 9/2005 | Delsing et al. | |
| 2005/0253500 A1 | 11/2005 | Gotoh et al. | |
| 2005/0267243 A1 | 12/2005 | Amasaki et al. | |
| 2006/0006782 A1 | 1/2006 | Nagatomi et al. | |
| 2006/0017365 A1 | 1/2006 | Nagatomi et al. | |
| 2006/0021788 A1 | 2/2006 | Kohayashi et al. | |
| 2006/0022573 A1 | 2/2006 | Gotoh et al. | |
| 2006/0033083 A1 | 2/2006 | Sakane et al. | |
| 2006/0043337 A1 | 3/2006 | Sakane et al. | |
| 2006/0045832 A1 | 3/2006 | Nagatomi et al. | |
| 2006/0065878 A1 | 3/2006 | Sakane et al. | |
| 2006/0076883 A1* | 4/2006 | Himaki et al. | 313/503 |
| 2006/0091790 A1 | 5/2006 | Nagatomi et al. | |
| 2006/0170332 A1 | 8/2006 | Tamaki et al. | |
| 2006/0197432 A1 | 9/2006 | Nagatomi et al. | |
| 2006/0197439 A1 | 9/2006 | Sakane et al. | |
| 2006/0220047 A1 | 10/2006 | Nagatomi et al. | |
| 2006/0220520 A1 | 10/2006 | Sakane et al. | |
| 2006/0244356 A1 | 11/2006 | Nagatomi et al. | |
| 2007/0007494 A1 | 1/2007 | Hirosaki et al. | |
| 2007/0029525 A1 | 2/2007 | Gotoh et al. | |
| 2007/0164308 A1 | 7/2007 | Yoshimura et al. | |

FOREIGN PATENT DOCUMENTS

| | | |
|---|---|---|
| EP | 1 296 376 A2 | 3/2003 |
| EP | 1 445 295 A1 | 8/2004 |
| JP | 05-015655 | 1/1993 |
| JP | 05-198433 | 8/1993 |
| JP | 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2002-363554 | 12/2002 |
| JP | 2003-013059 | 1/2003 |
| JP | 2003-096446 | 4/2003 |
| JP | 2003-124527 | 4/2003 |
| JP | A 2003-515655 | 5/2003 |
| JP | A 2003-277746 | 10/2003 |
| JP | 2003-336059 | 11/2003 |
| JP | 2004-055910 | 2/2004 |
| JP | 2004-505470 | 2/2004 |
| JP | A 2004-505470 | 2/2004 |
| JP | 2004-067837 | 3/2004 |
| JP | 2004-145718 | 5/2004 |
| JP | 2004-166058 | 6/2004 |
| JP | 2004-189997 | 7/2004 |
| JP | 2004-207271 | 7/2004 |
| JP | A-2004-186278 | 7/2004 |
| JP | 2004-235598 | 8/2004 |
| JP | 2004-248405 | 8/2004 |
| JP | 2004-250920 | 8/2004 |
| JP | 2004-253312 | 8/2004 |
| JP | 2004-244560 | 9/2004 |
| JP | 2004-055536 | 12/2004 |
| JP | 2004-368153 | 12/2004 |
| JP | 2005-075854 | 3/2005 |
| JP | 2005-103429 | 3/2005 |
| JP | 2005-105126 | 3/2005 |
| JP | 2005-192691 | 6/2005 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| JP | A-2006-282809 | 10/2006 |
| JP | A-2006-282872 | 10/2006 |
| WO | WO 01/40403 A1 | 6/2001 |
| WO | WO 02/11214 A1 | 2/2002 |
| WO | WO 2004/030109 A1 | 4/2004 |
| WO | WO 2004-039915 A1 | 5/2004 |
| WO | WO 2004/055910 A1 | 7/2004 |
| WO | WO 2005/052087 A1 | 6/2005 |
| WO | WO 2006/093298 A1 | 9/2006 |

OTHER PUBLICATIONS

U.S. Appl. No. 11/194,590, filed Aug. 2, 2005.
U.S. Appl. No. 10/984,772, filed Nov. 10, 2004, Nagatomi et al.
U.S. Appl. No. 11/063,847, filed Feb. 23, 2005, Sakane et al.
U.S. Appl. No. 11/149,317, filed Jun. 10, 2005, Nagatomi et al.
U.S. Appl. No. 11/149,192, filed Jun. 10, 2005, Sakane et al.
U.S. Appl. No. 11/198,281, filed Aug. 8, 2005, Nagatomi et al.
U.S. Appl. No. 11/194,590, filed Aug. 2, 2005, Gotoh et al.
U.S. Appl. No. 11/211,751, filed Aug. 26, 2005, Sakane et al.
U.S. Appl. No. 11/218,504, filed Sep. 6, 2005, Nagatomi et al.
JIS Z 8726; "Method of Specifying Colour Rendering Properties of Light Sources"; (1990), pp. 381-390.
"Phosphor Handbook"; (compiled by Phosphor Research Society, published by Ohmusha, Ltd., 1987); pp. 172-176.

* cited by examiner

PHOSPHOR MIXTURE AND LIGHT EMITTING DEVICE

FIELD OF THE INVENTION

The present invention relates to a phosphor mixture used for an illumination device such as a light emitting diode (LED), vacuum fluorescent display, and a fluorescent lamp, and a light emitting device using the phosphor mixture.

BACKGROUND OF THE INVENTION

As a light emitting device conventionally used as an illumination device, a discharge-type fluorescent lamp and an incandescent lamp and so forth are given as examples. However, in recent years, a light emitting diode that emits white light has been developed. The white LED lighting unit serves as an ideal illumination device having advantages that the generation of heat is reduced, luminous efficacy is excellent, power consumption is reduced, having long service life without blowing filament like the conventional incandescent light bulb, and capable of eliminating a harmful material such as mercury having an influence on environment, which is indispensable to the conventional fluorescent lamp.

As required elements as a light source for a general lighting unit such as the aforementioned white LED lighting unit, the elements of luminance and color rendering properties are given as examples.

First, explanation will be given to the element of luminance representing the brightness of the light source.

For example, even if the intensity of the emission emitted from the light source is physically same, compared with a yellow light and a green light, a blue light of a short wavelength side and a red light of a long wavelength side are felt darker for human eyes. The reason is that a yellow-green light at about 555 nm wavelength most brightly responds to the visibility of human beings. Therefore, when the light emitted from the light source has larger emission component at 555 nm or around, even the same color tone becomes visually brighter, and an index to indicate the brightness of the light source for human vision is the luminance.

Next, based on the color of the object responding to human vision when solar light is applied on an object, the color rendering properties are expressed as a value of reproducibility (approximation) of color of the object responding to human vision when lights from the light source is applied on the object.

According to JIS Z 8726, the color rendering properties of the light source is expressed in a numeric value by a general color rendering index (Ra). This is the value by which the difference between the color of a color rendering reference sample when illuminated by a sample light source, and the color of the reference sample when irradiated with a reference light analogous to a natural light is evaluated. When there is no difference between above colors, showing absolutely the same color, the color rendering index is expressed by 100. Even if having the same color temperature of the light source, the way of looks of color due is varied according to the color rendering index, and therefore if the color rendering index is low, the color due looks darker and dull. Therefore, the light source which emits light over the whole visible light region can be the light source with good color rendering properties.

At present, in the white LED lighting unit becoming widely used as a general lighting unit, generally the LED emitting blue light and a phosphor emitting yellow light excited by receiving the blue light are combined to obtain an emission that looks white for human eyes by a synthesized emission wavelength of the blue light and the yellow emission. However, in this system, since the emission that looks white is formed of the blue light and the yellow emission, green and red parts required as the light source for lighting unit become insufficient. A problem involved therein is that the color rendering properties are deteriorated. Particularly, a color component of a long wavelength side of the visible light region, that is, the component of red color is insufficient. Therefore, the emission looks slightly bluish white, although it looks white at first glance. Accordingly, when the white LED lighting unit is used as the general lighting unit, as for a red object, it looks significantly dull red and deteriorated in color rendering properties, thereby being improper as the light source. In addition, lack of the red emission component makes it impossible to obtain slightly reddish white emission such as warm white of 4500K or less in a correlated color temperature.

In order to improve the color rendering properties of the aforementioned white LED lighting unit, the white LED lighting unit has been developed, having a structure that the blue LED, the phosphor excited by receiving the blue light emitted by the LED to emit yellow light, and the phosphor excited by receiving the blue light emitted by the LED to emit red light are combined, to obtain the white light by the combination of the blue light, the yellow emission, and the red emission. Also, the white LED lighting unit improved in color rendering properties has been developed, having another structure that the blue LED, the phosphor excited by receiving the blue light emitted by the LED to emit green light, and the phosphor excited by receiving the blue light emitted by the LED to emit red light are combined, to obtain the white light by the combination of the blue light, the green emission and the red emission. It is considered that the white LED lighting unit thus constructed to obtain the white light by combination of the blue LED and a plurality of phosphors, is capable of obtaining an arbitrary emission color other than the white color, according to the combination and mixing ratio of the phosphors.

However, the aforementioned white LED lighting unit by combination of the conventional blue LED and phosphors has a problem that the emission efficiency of the red phosphor used therein is low and the emission is therefore dark. Therefore, when manufacturing the white LED lighting unit, the mixing ratio of the red phosphor must be increased out of the mixing ratio of the phosphors, compared with the phosphors of other colors. This causes the mixing ratio of the phosphors of other colors to be reduced, thereby making it impossible to obtain the white light having a high luminance this time. Particularly, in the white LED lighting unit, in which emission component of the long wavelength side (red color side) occupies a large ratio and the light of low color temperature such as warm white is required, necessary quantity of the red color phosphor is further increased. Therefore, compounded quantities of the phosphors of other colors are relatively further decreased, and the yellow-green light having an emission spectrum with a peak wavelength at about 555 nm which looks brightest for the visibility of human beings becomes relatively insufficient. The problem conspicuously involved therein is that the luminance in the entirety of the white LED lighting unit is further deteriorated.

Therefore, in recent years, in order to solve the problem that, in the case of being excited by the light having emission spectrum with a peak wavelength at long wavelength range, the emission efficiency of the aforementioned red phosphor is lower than that of the phosphors of other colors, as the red color phosphor having an excitation spectrum with good excitation band on the long wavelength side and having an emission spectrum with wide half-value width, the phosphor containing nitrogen, for example, silicon nitride such as $(Ca, Sr)_2Si_5N_8:Eu$ is reported. Then, by combining the blue light emitted from a blue LED, the yellow light emitted from a phosphor represented by YAG:Ce, which emits yellow light when excited by the blue light emitted from the LED, and the red light emitted from the red phosphor containing the nitrogen, which is excited by receiving the blue light emitted from the LED to emit the red light, the illumination device with increased luminance and further improved color rendering properties is proposed (see patent documents 1 to 4).

(Patent Document 1)
  PCT Japanese Publication No. 2003-515655
(Patent Document 2)
  Japanese Patent Publication No. 2003-277746
(Patent Document 3)
  PCT Japanese Publication No. 2004-505470
(Patent Document 4)
  WO2004/039915 pamphlet A1 number By combining the aforementioned LED emitting blue light, yellow phosphor such as YAG, and nitride red phosphor, or by combining the aforementioned LED emitting blue light, green to orange phosphor, and nitride red phosphor, the white light whose luminance is secured and having good color rendering properties can be obtained in the white light exceeding 5000K in correlated color temperature.

However, according to the study of inventors of the present invention, the problem is that in the region of 4500K or less in correlated color temperature, it is difficult to obtain the light having a sufficient luminance even by a method of combining the aforementioned blue LED, yellow phosphor, and nitride red phosphor. Particularly, the problem is that in the slightly reddish warm white of about 3000K in color temperature, sufficient luminance can not be obtained, thus being felt dark for human beings.

Also, it is found that even when the white light in the region of 4500K or less at correlated color temperature is obtained by the method of combining the aforementioned blue LED, green to orange phosphor, and nitride red phosphor, the light having the good color rendering properties can not be obtained. It is considered as a reason therefore that the light on the side of long wavelength of 630 nm or more is insufficient in the white light.

Therefore, the inventors of the present invention study on the known red phosphor also other than the aforementioned nitride red phosphor. However, it is found that any of the red phosphors can not exert sufficient luminance and obtain the light having a high color rendering properties, with its low emission efficiency, when the blue LED is emitted as the excitation light.

Meanwhile, it is considered that the light source such as LED lighting unit is desired, producing light of white or other desired colors having the sufficient luminance and excellent in color rendering properties, even in the light of not only the white color having high color temperature but also the warm white having low color temperature. However, it is found that in the light emitting device in which the phosphors such as the nitride red phosphor according to the conventional technique are combined using the blue LED as the excitation light, it is insufficient to have a sufficient luminance and further obtain the emission improved in color rendering properties.

SUMMARY OF THE INVENTION

In view of the above-described circumstances, the present invention is provided, and an object of the present invention is to provide a phosphor mixture containing more than one kind of phosphor having an emission spectrum having a peak wavelength of 500 nm to 630 nm, having a sufficient luminance and further excellent in color rendering properties not only in the white emission at high correlated color temperature but also even in warm white emission of 4500K or less in correlated color temperature, for example, and a light emitting device having the phosphor mixture and the light emitting part.

Here, the inventors of the present invention have studied to respond to the aforementioned problem, and a new red phosphor is thereby manufactured. Such a new red phosphor has an emission spectrum with a peak (the peak of the emission spectrum is referred to only as a peak as needed hereafter) in the wavelength range from 630 to 680 nm, and has an excitation band corresponding to the light having wide range of wavelengths from ultraviolet to visible light (such as green light). Then, the phosphor mixture is provided by combining the red phosphor with at least more than one kind of phosphor. Such a phosphor mixture has the excitation band in the range from ultraviolet to visible light (such as blue light) in the same way as the red phosphor, has the emission spectrum with a peak in the wavelength range from 500 nm to 630 nm. Thus, it becomes possible to combine the phosphor mixture and various light sources (light emitting part) that emits excitation light in the wide range from ultraviolet to visible light (such as green light), to attain the light emitting device capable of producing light of white or other desired colors by which the luminance is improved even in the region at low correlated color temperature and excellent in color rendering properties.

Specifically, in order to solve the above-described problem, the present invention takes a few aspects as follows.

In a first aspect, a phosphor mixture is provided, comprising a red phosphor expressed by a composition formula $M_mA_aB_bO_oN_n:Z$ (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by $m=a=b=1$, $o<0.5$, $n=3-2/3o$.), and more than one kind of phosphor having an emission spectrum with a peak in the wavelength range from 500 nm to 630 nm.

In a second aspect, the phosphor mixture according to the first aspect is provided, wherein one kind of the phosphor having the emission spectrum with a peak in the wavelength range from 500 nm to 630 nm is expressed by the composition formula $M_mA_aB_bO_oN_n:Z$ (wherein element M is more than one kind of element having bivalent valency, element A is the more than one kind of element having tervalent valency, element B is more than one kind of element having tetravalent valency, O is oxygen, N is nitrogen, element Z is the element acting as an activator in the phosphor, expressed by $n=2/3m+a+4/3b-2/3o$, $m>0$, $a=0$, $b>0$, $o=0$).

In a third aspect, the phosphor mixture according to either of the first or the second aspect is provided, wherein one kind of the phosphor having the emission spectrum with a peak in the wavelength range from 500 nm to 630 nm is expressed by the composition formula $M_mA_aB_bO_oN_n:Z$ (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by $m=1.0$, $a=2.0$, $3.0=b=6.0$, $o<1.0$, $n=8/3+4/3b-2/3o$).

In a fourth aspect, the phosphor mixture according to any one of the first to third aspects is provided, wherein the element M is more than one kind of element selected from a group consisting of Ca, Mg, Sr, Ba, and Zn, the element A is more than one kind of element selected from the group consisting of Al and Ga, the element B is more than one kind of element selected from the group consisting of Si and Ge, and the element Z is more than one kind of element selected from rare earth elements and transition metal elements.

In a fifth aspect, the phosphor mixture according to any one of the first to fourth aspects is provided, wherein the element Z is Eu.

In a sixth aspect, the phosphor mixture according to any one of the first to fifth aspects is provided, wherein each of the phosphors has an emission spectrum of 50 nm or more in half-value width.

In a seventh aspect, the phosphor mixture according to any one of the first to sixth aspects is provided. Such a phosphor mixture has a continuous emission spectrum which has a correlated color temperature from 7000K to 2000K and has not a break in the wavelength range from 500 nm to 780 nm, when excited by excitation light in the wavelength range from 430 nm to 500 nm.

In an eighth aspect, the phosphor mixture according to any one of the first to seventh aspects is provided. Such a phosphor mixture has a continuous emission spectrum which has a correlated color temperature from 4500K to 2000K and has two or more emission peaks in the wavelength range from 500 nm to 780 nm, when excited by excitation light in the wavelength range from 430 nm to 500 nm.

In a ninth aspect, the phosphor mixture according to any one of the first to eighth aspects is provided. Such a phosphor mixture has the emission spectrum of which the chromaticity satisfies x>0.2, y>0.2 when excited by the excitation light in the wavelength range from 430 nm to 500 nm.

In a tenth aspect, the phosphor mixture according to any one of the first to ninth aspects is provided, wherein each phosphor comprises particles having an average particle diameter of 0.1 to 20 μm.

In an eleventh aspect, a light emitting device is provided. Such a light emitting device has the phosphor mixture according to any one of the first to tenth aspects and a light emitting part having an emission spectrum with a peak in the wavelength range from 430 nm to 500 nm.

In a twelfth aspect, the light emitting device according to the eleventh aspect is provided, wherein general color rendering index Ra of the light emitting device is set at not less than 80.

In a thirteenth aspect, the light emitting device according to either of eleventh or twelfth aspect is provided, emitting the light of which special color rendering index R9 is set at not less than 60.

In a fourteenth aspect, the light emitting device according to any one of the eleventh to thirteenth aspects is provided, emitting the light of which special color rendering index R15 is set at not less than 80.

In a fifteenth aspect, the light emitting device according to any one of the eleventh to fourteenth aspects is provided, emitting the light which has a correlated color temperature from 7000K to 2500K.

In a sixteenth aspect, the light emitting device according to any one of the eleventh to fifteenth aspects is provided, emitting the light having a correlated color temperature from 4500K to 2500K.

In a seventeenth aspect, the light emitting device according to any one of the eleventh to sixteenth aspects is provided, emitting the light of which the chromaticity satisfies x>0.3, y>0.3.

In an eighteenth aspect, the light emitting device according to any one of the eleventh to seventeenth aspects is provided, wherein the light emitting part is an light emitting diode (LED).

In a nineteenth aspect, the light emitting device according to the eighteenth aspect is provided, wherein the light emitting part is the light emitting diode (LED) formed of a material containing Ga.

The phosphor mixture according to the first aspect emits the light such as white light having a sufficient luminance even at a correlated color temperature of not more than 4500K, when the phosphor mixture is irradiated with a prescribed excitation light.

The phosphor mixture according to either of the second or the third aspect emits the light such as white light having a sufficient luminance and excellent in color rendering properties even at a correlated color temperature of not more than 4500K, when the phosphor mixture is irradiated with a prescribed excitation light.

The phosphor mixture according to any one of the fourth to tenth aspects emits the light such as white light having a sufficient luminance or the light such as white light having the sufficient luminance and excellent in color rendering properties even at the correlated color temperature of not more than 4500K, when the phosphor mixture is irradiated with the prescribed excitation light.

The light emitting device according to any one of the eleventh to nineteenth aspects emits the light such as white light having the sufficient luminance or the light such as white light having the sufficient luminance and excellent in color rendering properties even at the correlated color temperature of not more than 4500K.

DETAILED DESCRIPTION OF THE PREFERRED EMBODIMENTS

Figure 1:
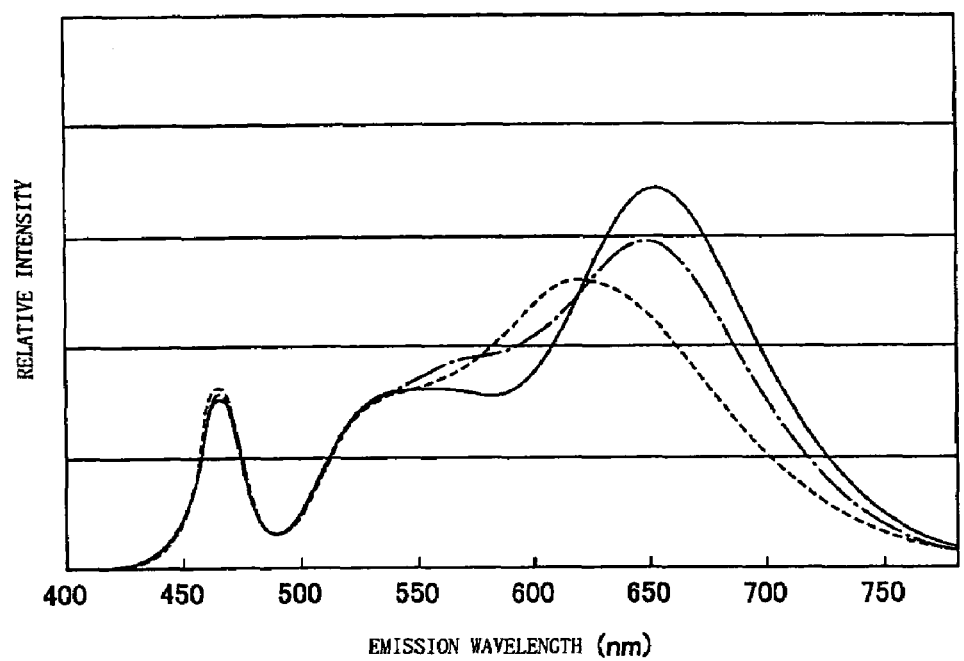
FIG. 1 shows emission spectra pattern of phosphor mixtures according to an embodiment and a comparative example, having a correlated color temperature of 2800K.

The phosphor mixture according to the present invention comprises a red phosphor expressed by a composition formula $M_mA_aB_bO_oN_n:Z$ (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by m=a=b=1, o<0.5, n=3−2/3o.), and more than one kind of phosphor having an emission spectrum with a peak in the wavelength range from 500 to 630 nm. The phosphor mixture thus constituted has an emission spectrum over the entire region of the visible light, thereby realizing the phosphor mixture capable of obtaining the light emitting device emitting the light such as white light having a sufficient luminance and excellent in color rendering properties even at the correlated color temperature of not more than 4500K.

First, as the red phosphor contained in the phosphor mixture according to the present invention, the phosphor expressed by a composition formula MmAaBbOoNn:Z will be explained.

In the composition formula of the red phosphor, element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by m=a=b=1, o<0.5, n=3−2/3o. The red phosphor thus constituted emits red light of high luminance having an emission spectrum with a peak in the wavelength range from 630 nm to 700 nm with high efficiency when the red phosphor is irradiated with the light in the wavelength range from 250 nm to 550 nm as an excitation light. Further, the half-value width of the emission spectrum of the red phosphor is not less than 50 nm.

Note that "O" in the composition formula is derived from the oxygen contained in a raw material of the red phosphor at the time of manufacturing the red phosphor. However, preferably the "O" is a fewer value in view of an emission efficiency of the red phosphor.

Next, explanation will be given to the phosphor having a broad emission peak in the wavelength range from 500 nm to 630 nm contained in the phosphor mixture according to the present invention.

As the phosphor, the publicly-known phosphor having excitation characteristics and emission characteristics as will be explained hereunder can be used.

First, preferably the phosphor emits the light of high luminance having the emission spectrum with the broad peak in the wavelength range from 500 nm to 630 nm, with high efficiency when the phosphor is irradiated with the light in the wavelength range from 430 nm to 500 nm, further preferably in the wavelength range from 450 nm to 480 nm as the excitation light. Accordingly, it is preferable that the half-value width of the emission spectrum of the phosphor is not less than 50 nm. As the phosphor, the phosphor with garnet structure such as YAG:Ce, $Ca_3Sc_2Si_3O_{12}$:Ce, TAG:Ce, a silicic acid-based phosphor such as $(Ca, Ba, Sr)_2SiO_4$:Eu, a sulfide phosphor such as ZnS:Cu, Al, $CaGa_2S_4$:Eu, $SrGa_2S_4$:Eu, $BaGa_2S_4$:Eu, $(Ca, Sr, Ba)(Al, Ga, In)_2S_4$:Eu, and a nitride phosphor such as $CaSi_2O_2N_2$:Eu, $SrSi_2O_2N_2$:Eu, $BaSi_2O_2N_2$:Eu, $(Ca, Sr)Si_2O_2N_2$:Eu $(Sr, Ba)Si_2O_2N_2$:Eu, $(Ca, Ba)Si_2O_2N_2$:Eu, and an oxynitride phosphor can be given as examples. However, it is not limited thereto, provided that the aforementioned condition is satisfied.

Next, explanation will be given to the orange phosphor capable of improving the luminance and color rendering properties of the phosphor mixture, by the use along with the red phosphor according to the present invention.

As the orange phosphor, the phosphor expressed by a composition formula MmAaBbOoNn:Z (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by n=2/3m+a+4/3b−2/3o, m>0, a=0, b>0, o=0) can be used.

However, from the point of desiring more excellent color rendering properties, preferably the orange phosphor is used, the orange phosphor having the composition formula expressed by MmAaBbOoNn:Z as described in Japanese patent application No. 2004-241308, wherein element M is more than one kind of element having bivalent valency, element A is more than one kind of element having tervalent valency, element B is more than one kind of element having tetravalent valency, O is the oxygen, N is the nitrogen, element Z is the element acting as the activator in the phosphor, expressed by m=1, a=2, b=4, o<1.0, n=8/3+4/3b−2/3o. The orange phosphor having the above structure emits orange light of high luminance having the emission spectrum with a peak in the wavelength range from 570 nm to 630 nm, with high efficiency when the orange phosphor is irradiated with the light in the wavelength range from 430 nm to 500 nm as the excitation light. Further, the half-value width of the emission spectrum of the orange phosphor is set at not less than 50 nm.

Here, "O" in the composition formula is derived from the oxygen contained in the raw material of the orange phosphor when manufacturing the orange phosphor in the same way as the aforementioned red phosphor. However, preferably the "O" is a fewer value in view of the emission efficiency of the orange phosphor. Therefore, in the explanation for the structure of the phosphor as will be described hereunder, the "O" in the composition formula may be omitted in some cases.

Then, further explanation will be given to the element M, the element A, the element B, and the element Z contained in the red phosphor and the orange phosphor according to the present invention.

The element M is more than one kind of element having bivalent valency, however preferably more than one kind of element selected from a group consisting of Ca, Mg, Sr, Ba, and Zn. Materials of such elements are easily available, hardly giving loads to environments. Further, from this point of view, Ca is most preferable.

The element A is more than one kind of element having tervalent valency, and preferably is more than one kind of element selected from the group consisting of Al and Ga. The materials of such elements are also easily available, hardly giving loads to environments. Further, from this point of view, Al is most preferable.

The element B is more than one kind of element having tetravalent valency, and preferably is more than one kind of element selected from the group consisting of Si and Ge. The materials of such elements are also easily available, hardly giving loads to environments. Further, from this point of view, Si is most preferable.

The element Z is the element acting as the activator, and preferably is at least more than one kind of element selected from rare earth elements or transition metal elements. The materials of such elements are also easily available, hardly giving loads to environments. Further, from this point of view, Eu is most preferable.

As described above, the emission spectrum of the phosphor contained in the phosphor mixture according to the present invention has the half-value width of not less than 50 nm. As a result, the emission spectrum of the phosphor mixture becomes the spectrum having a light intensity over the entire region from the green to red visible lights. In this condition, when the phosphor mixture is irradiated with the excitation light in the wavelength range from 430 nm to 500 nm, by synthesizing with the spectrum of the excitation light, the emission spectrum that has the excellent color rendering properties can be obtained.

As described above, the light emitted from the phosphor mixture according to the present invention has a continuous emission spectrum having a correlated color temperature from 4200K to 2500K and has more than two peaks in the wavelength range from 500 nm to 780 nm and has not a sudden fluctuation or a break in the wavelength range from 500 nm to 780 nm. Consequently, the emission from the light emitting part and the phosphor mixture has sufficient yellow-green lights with a peak at about 555 nm which most brightly responds to the visibility of human beings. Therefore, the luminance most brightly responds to the visibility of the human beings can be sufficiently obtained as the lighting unit.

Further, if the phosphor mixture according to the present invention contains the aforementioned orange phosphor, since the emission from the phosphor mixture has the broad emission spectrum in the wavelength range from 420 nm to 780 nm, the emission becomes excellent in color rendering properties also, in addition to the sufficient luminance as described above. The reason is that by using the red phosphor and the orange phosphor together, the long wavelength side of a light-emitting region of the phosphor mixture is widened. As a result, it becomes possible to obtain the light excellent in color rendering properties even at the correlated color temperature of not more than 4500K.

Next, explanation will be given to the reason why the phosphor mixture according to the present invention excels particularly in color rendering properties at low correlated color temperature.

For example, in the white light at the color temperature from 7000K to 5000K, the color component of blue color and green color exists in large quantity in the emission spectrum of the reference light approximated the natural light, while the color component of the long wavelength region is low. Therefore, even if the red phosphor emitting light in the long wavelength region is insufficient in the phosphor mixture to be evaluated, it has not significant effect on the evaluation result of the color rendering properties of the white light. Meanwhile, for example, in the white light at color temperature of not more than 4500K, the color component of the long wavelength region such as orange color and red color exists in large quantity in the reference light approximated the natural light. Thus, consequently the red phosphor needs to be increased, thereby largely affecting on the evaluation result of the color rendering properties of the white light. Therefore, the phosphor mixture according to the present invention particularly exerts effect in the white light in the correlated color temperature range from 4500K to 2000K.

Here, with regard to a manufacturing method of the red phosphor according to the present invention, explanation will be given to the manufacture of the phosphor expressed by the composition formula $CaAlSiN_3$:Eu (wherein, Eu/(Ca+Eu) =0.020) as an example.

Each of the nitride raw materials of the element M, the element A, and the element B may be made of commercially available materials. However, since high purity is preferable, the nitride raw material of 2N or more is preferably prepared, and further preferably the nitride raw material of 3N or more is prepared. Generally, the particle diameter of each raw material particle is preferably a fine particle from the viewpoint of accelerating a reaction. However, the particle diameter and a shape of the phosphor thus obtained are varied, depending on the particle diameter and the shape of the raw material. Therefore, the nitride raw material having approximated particle diameter in accordance with the particle diameter required for the phosphor finally obtained, may be prepared. The raw material of the element Z is preferably commercially available nitride raw material or a single metal. However, an amount to be added is little, and therefore no problem is involved in using oxide. However, the purity is preferably higher after all, and therefore the nitride raw material of 2N or more is preferably prepared, and further preferably the nitride raw material of 3N or more is prepared.

In a case of manufacturing $Ca_{0.980}AlSiN_3$:$Eu_{0.020}$, $Ca_3N_2$ (2N), AlN(3N), $Si_3N_4$(3N) may be prepared respectively, as the nitride of the element M, the element A, and the element B, and $Eu_2O_3$(3N) may be prepared as the element Z. The raw materials thus prepared are weighed and mixed, by setting the mixing ratio of each raw material at 0.980/3 mol of $Ca_3N_2$, 1 mol of AlN, 1/3 mol of $Si_3N_4$, and 0.020/2 mol of $Eu_2O_3$, respectively, so that a molar ratio of each element satisfies Ca:Al:Si:Eu=0.980:1:1:0.020. Since the $Ca_3N_2$ is easily oxidized, it is convenient to perform the weighing/mixing in a glove box under an inert atmosphere. In addition, each raw material is easily affected by moisture, and therefore preferably the inert gas from which the moisture is sufficiently removed is used. Either of a wet type or a dry type may be equally used as a mixing type. However, when pure water is used as a wet-mixing solvent, the raw material is decomposed, and therefore a proper organic solvent needs to be selected. As a device, usual ball mill and mortar, and so forth may be used.

The raw material thus mixed is put in a crucible, retained in the inert atmosphere such as nitrogen at 1000° C. or more, preferably at 1400° C. or more, further preferably 1500° C. or more for 30 minutes or more, preferably for 3 hours, and fired. The higher the firing temperature is, the more rapidly the firing is advanced, and the maintaining time is therefore shortened. Meanwhile, even when the firing temperature is low, the target emission characteristics can be obtained by maintaining the temperature for a long time. However, the longer the firing time is, the more rapidly the particle growth is advanced, and the particle diameter becomes therefore large. Therefore, the firing time may be set in accordance with the target particle diameter. Pressure of the inert atmosphere during firing is preferably set at 0.5 MPa or less to fire. The reason is that the firing under the pressure of 0.5 Mpa or less avoids particles' firing excessively, thereby facilitating the crushing of the raw material after firing.

Note that the crucible such as an $Al_2O_3$ crucible, a $Si_3N_4$ crucible, an AlN crucible, a sialon crucible, a C (carbon) crucible, and a BN (boron nitride) crucible with high purity without intrusion of impurities, which can be used in the inert atmosphere, may be used. However, the BN crucible is capable of averting the intrusion of impurities from the crucible and is therefore preferably used.

After the firing is completed, the fired object is taken out from the crucible, and is crushed up to a predetermined average particle diameter, to manufacture the phosphor expressed by the composition formula $Ca_{0.980}AlSiN_3$:$Eu_{0.020}$. Here, when $Eu_2O_3$ is used as the Eu raw material, although by a small quantity, the oxygen is added. Therefore, the composition formula is expressed by $Ca_{0.980}AlSiO_{0.03}N_{2.96}$:$Eu_{0.020}$. However, an amount of the oxygen is small, and no problem is particularly involved therein. Note that when the amount of the oxygen is further decreased, Eu metal or Eu nitride may be used as the Eu raw material. When other element is used as the element M, the element A, the element B, and the element Z, and when an amount of activation of the Eu, which is an activator, is changed, the phosphor can be manufactured in the same way as the aforementioned manufacturing method, by matching a blending amount at the time of mixing each raw material with a predetermined composition ratio.

In addition, the aforementioned orange phosphor according to the present invention can also be manufactured in the same way as the aforementioned manufacturing method, by matching the blending amount at the time of mixing each raw material with the predetermined composition ratio.

Next, explanation will be given to a method of obtaining the phosphor mixture according to the present invention obtained by mixing the red phosphor obtained by the aforementioned manufacturing method and more than one kind of phosphor having the emission spectrum with a peak in the wavelength range from 500 nm to 630 nm.

The phosphor mixture is provided by mixing the aforementioned phosphors, and by setting the mixing ratio of the phosphors thus mixed, the correlated color temperature of the emission spectrum obtained when the phosphor mixture is irradiated with the excitation light in the wavelength range from 430 nm to 500 nm can be set at a desired value between 7000K and 2000K. Specifically, by measuring each emission spectrum of phosphors when phosphors are excited by the excitation light, further, by measuring the emission spectrum of the excitation light in the wavelength range from 430 nm to 500 nm emitted from the light emitting part (such as LED), and by synthesizing the spectra thus obtained by simulation, the mixing ratio of each phosphor for obtaining a desired correlated color temperature may be determined. Further, in addition to the correlated color temperature, the color rendering properties and the desired chromaticity coordinates are also obtained. Then, the mixing ratio may be adjusted in accordance with the correlated color temperature, the color rendering properties, and the desired chromaticity coordinates thus obtained. Each of the aforementioned phosphors has the half-value width of not less than 50 nm. Therefore, each emission spectrum is superimposed with the emission spectrum of the light emitting part. Then, the continuous and broad emission spectrum is obtained, which has not a sudden fluctuation or a break in the wavelength range from 420 nm to 780 nm. In addition, since the phosphor of each color has the excitation band in the same range, the mixing ratio of each phosphor can be easily adjusted.

Note that when the phosphor mixture is provided by mixing the phosphors, the chromaticity of emission spectrum which the phosphor mixture emits adjusted to be x>0.2, and y>0.2, when the phosphor mixture is excited by the excitation light in the wavelength range from 430 nm to 500 nm. The white LED lighting unit can be thus made with good efficiency, by using the phosphor mixture. Meanwhile, when the chromaticity of the emission spectrum of the phosphor mixture is set at x<0.2 or y<0.2, the emission of the LED lighting unit thus made becomes almost a single color such as the blue color and the green color.

When the phosphor mixture according to the present invention is used as powdery state, the average particle diameter of each phosphor powder mixed is preferably set at 20 μm or less, respectively. The reason is that since the emission in the phosphor powder is considered to occur mainly on the surface of the powdery particle, the average particle diameter of 20 μm or less ensures a surface area per powder unit weight, thereby averting the deterioration in the luminance. Further, in the manufacture of the lighting unit by using the phosphor mixture powder, the phosphor mixture powder is formed into a pasty form, and for example, when the pasty phosphor powder is applied on a light emitting element and so forth, the density of the powder can be increased, and from this viewpoint, the deterioration in the luminance can be averted. In addition, according to the study of the inventors of the present invention, although a detailed reason is not clarified yet, from the viewpoint of the emission efficiency of the phosphor powder, it was found that the average particle diameter was preferably larger than 0.1 μm. As described above, preferably the average particle diameter of the phosphor powder is 0.1 μm to 20 μm.

By combining the phosphor mixture formed into the powdery state according to the present invention, and the light emitting part that emits the light in the wavelength range from 430 nm to 500 nm, preferably in the wavelength range from 440 nm to 480 nm, various kinds of lighting units and display devices can be manufactured.

As the light emitting part, for example, LED that emits blue light formed of the material containing Ga, and a discharge lamp that emits blue light, are considered. Then, when the phosphor mixture according to the present invention is combined with the aforementioned LED, various kinds of lighting units and display devices can be manufactured. Also, when the phosphor mixture according to the present invention is combined with the aforementioned discharge lamp, various kinds of fluorescent lamps, lighting units, and display devices can be manufactured.

The method of combining the phosphor mixture according to the present invention and the light emitting part may be performed by a publicly-known method. However, in the case of the light emitting device by using the LED in the light emitting part, the light emitting device can be made as described below.

Hereafter, explanation will be given to the light emitting device by using the LED that emits blue light formed of the material containing Ga in the light emitting part.

Figure 3:
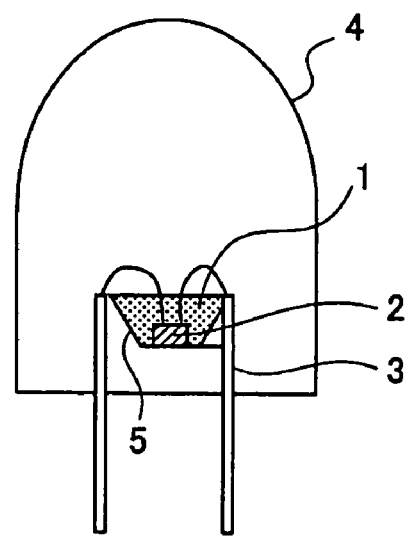
FIGS. 3A, 3B, and 3C are sectional views showing standard type LED light emitting device according to the embodiment.
Figure 3:
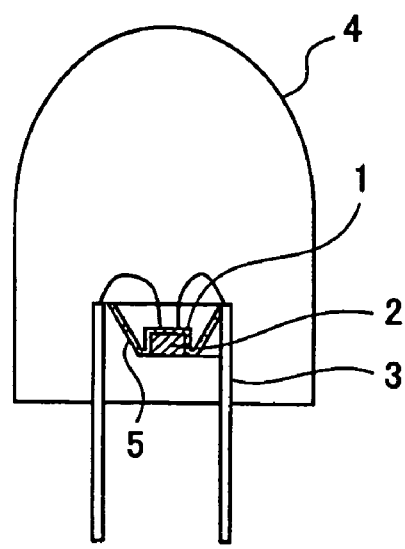
Figure 3:
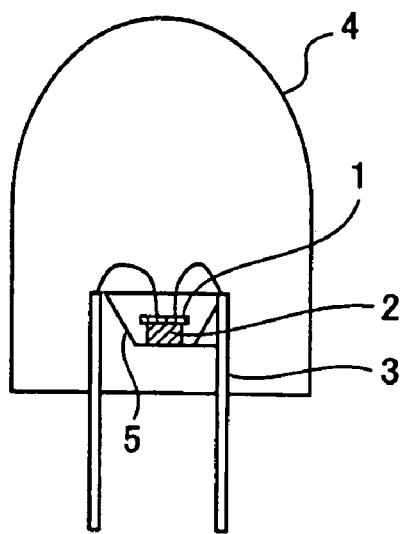

FIG. 3A to FIG. 3C are schematic sectional views of a standard type LED light emitting device, and FIG. 4A to FIG. 4E are schematic sectional views of a reflection type LED light emitting device. Note that in each figure, the corresponding parts are designated by the same signs and numerals, and explanation is omitted in some cases.

First, by using FIG. 3A, explanation will be given to an example of the light emitting device using the LED in the light emitting part, and is combined with the phosphor mixture according to the present invention.

In the standard type LED light emitting device, a light emitting element 2 is installed in a cup-formed container 5 provided on a tip end of a lead frame 3. In the present embodiment, the phosphor mixture according to the present invention or a mixture obtained by dispersing the phosphor mixture into a transparent resin such as silicon and epoxy (referred to as phosphor mixture 1 hereafter) are filled in a whole part of the cup-formed container 5, and the light emitting element 2 is thereby embedded, so that the phosphor mixture 1 is molded by a transmittable resin 4 together with a part of the lead frame 3 and the cup-formed container 5.

Next, a different mode of the light emitting device will be explained by using FIG. 3B.

In the embodiment, the phosphor mixture 1 is applied on an upper surface of the cup-formed container 5 and the light emitting element 2.

Next, further different mode of the light emitting device will be explained by using FIG. 3C.

In this embodiment, the phosphor mixture 1 is placed on an upper part of the light emitting element 2.

As described above, in the standard type light emitting device explained by using FIG. 3A to FIG. 3C, the light is released upward from the light emitting element 2. However, even if the light is released downward, the light emitting device can be made in the same method. For example, a reflection type light emitting device is formed in such a manner that a reflection surface is disposed in a releasing direction of the light emitted from the light emitting element and the light released from the element is made to reflect by the reflection surface so as to be emitted outside. Here, by using FIG. 4A to FIG. 4E, explanation will be given to the reflection type light emitting device to which the phosphor mixture according to the present invention is applied.

Figures 4A, 4B, 4C, 4D, 4E:
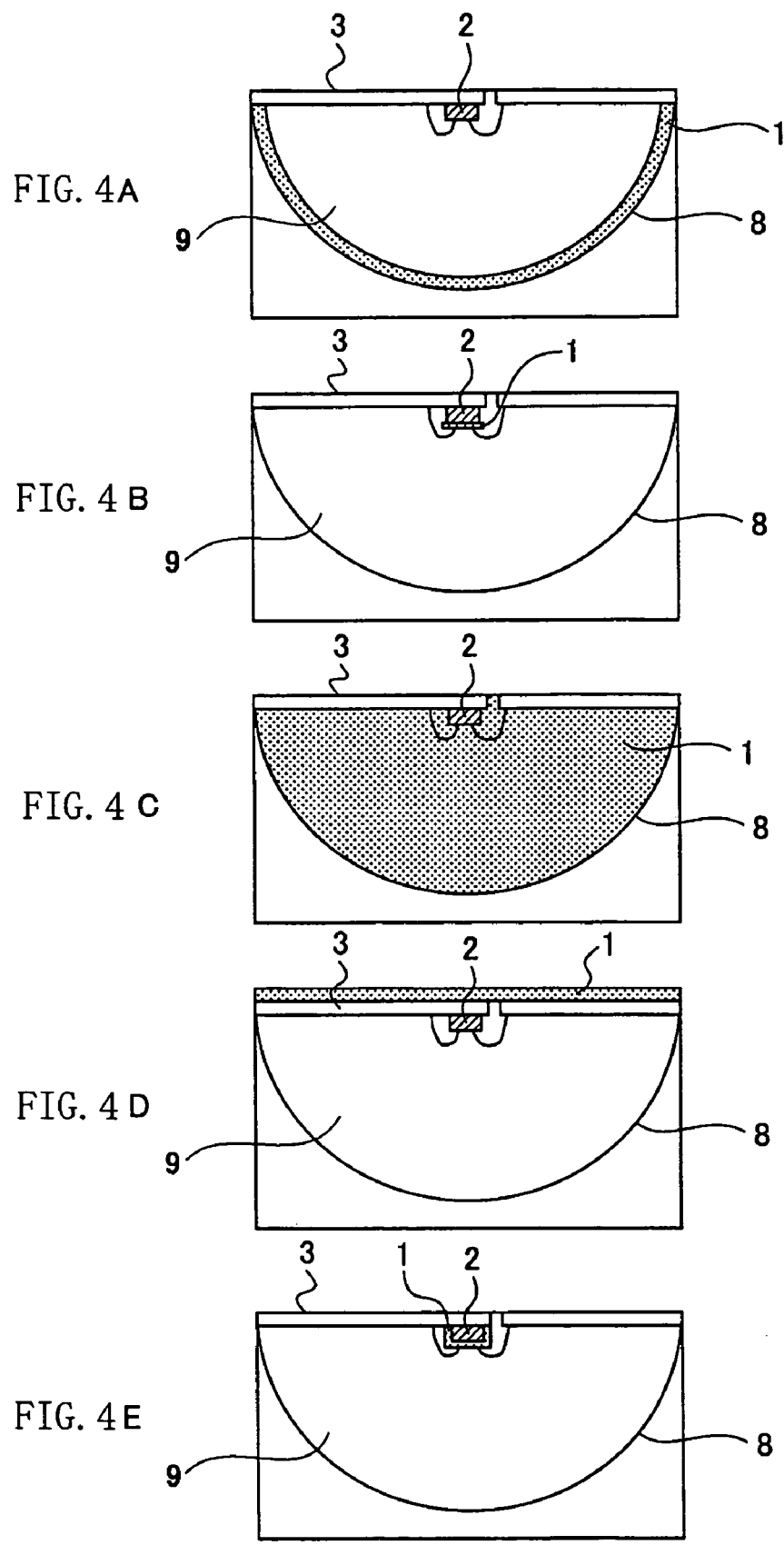
FIGS. 4A, 4B, 4C, 4D, and 4E are sectional views showing a reflection type LED light emitting device according to the embodiment.

First, by using FIG. 4A, explanation will be given to an example of the light emitting device which uses the LED in the light emitting part, and which is combined with the phosphor mixture according to the present invention.

In the reflection type LED light emitting device, the light emitting element 2 is installed at the tip end of one of the lead frame 3, the light emitted from the light emitting element is directed downward, reflected by a reflection surface 8, and released upward. In this embodiment, the phosphor mixture 1 is applied on the reflection surface 8. Note that in some cases, in a grooved portion formed by the reflection surface 8, a transparent molding material 9 for protecting the light emitting element 2 is filled.

Next, an example of a different mode of the light emitting device will be explained by using FIG. 4B.

In this embodiment, the phosphor mixture is installed in a lower part of the light emitting element 2.

Next, an example of the different mode of the light emitting device will be explained by using FIG. 4C.

In this embodiment, the phosphor mixture 1 is filled in the grooved portion formed by the reflection surface 8.

Next, an example of the different mode of the light emitting device will be explained by using FIG. 4D.

In this embodiment, the phosphor mixture 1 is applied on an upper part of the transparent molding material 9 for protecting the light emitting element 2.

Next, an example of the different mode of the light emitting device will be explained by using FIG. 4E.

In this embodiment, the phosphor mixture 1 is applied on the surface of the light emitting element 2.

The standard type LED light emitting device and the reflection type LED light emitting device may be appropriately used in accordance with application. However, the reflection type LED light emitting device has advantages that it can be made thin, a light emitting area can be made large, and utilization efficiency of light can be improved.

When the light emitting device as described above is used as a general lighting light source, the light emitting device is required to have a sufficient luminance, and further is required to be excellent in color rendering properties. Therefore, the luminance was measured for the light emitted from the light emitting device in which the phosphor mixture of the present invention was incorporated, based on a calculation method in the XYZ colorimetric system regulated in the JIS Z 8701, and further by using the evaluation method of the JIS Z 8726, the color rendering properties was evaluated. The light emitting device was made for the evaluation, in which the phosphor mixture according to the present invention is irradiated with the light from the light emitting part emitting the light in the wavelength range from 430 nm to 500 nm, and the phosphor mixture thereby emits the light. Note that as the light emitting part, the light emitting diode (LED) that emits blue light formed of the material containing Ga was used.

Then, it was found that the luminance of the light emitted from the light emitting device in which the phosphor mixture according to the present invention was incorporated, was increased by 20% at the correlated color temperature of 4500K or less, compared with the light emitting device using the conventional phosphor.

Next, the color rendering properties of the light emitted by the light emitting device was evaluated. As a result, it was found that the light emitting device, in which the phosphor of the present invention is incorporated, was a significantly excellent light source, showing the emission spectrum satisfying x>0.2, y>0.2, capable of easily showing the color rendering properties of Ra, R9, and R15, which are 80 or more, 60 or more, and 80 or more, respectively, and showing significantly high color rendering properties of Ra, R9, and R15, which are 90 or more, 95 or more, and 96 or more, respectively, in the correlated color temperature range from 7000 to 2000K, by properly adjusting the mixing ratio of the phosphor in the correlated color temperature range from 4000 to 2600K. Therefore, it was found that such a light emitting device served as a significantly excellent light source. Here, the general color rendering index Ra is 80 or more, the special color rendering index R9, which is an index showing a red component, is 60 or more, and further preferably, the special color rendering index R15, which is the index showing a flesh color of Japanese women, is 80 or more. Therefore, it can be said that the light emitted by the light emitting device is significantly excellent in color rendering properties.

Further, in the phosphor mixture according to the present invention, by properly changing the blending ratio of each phosphor, various kinds of emission colors, which can not be obtained heretofore, can be obtained.

EMBODIMENTS

The present invention will be more specifically explained, based on an embodiment.

Embodiment 1

In the embodiment 1, the phosphor mixture having the emission spectrum which has the correlated color temperature of 2800K when excited by the light emitting element (LED) emitting the light having an emission spectrum with a peak at 470 nm, was manufactured by mixing the red phosphor $CaAlSiN_3$:Eu and the phosphor having the emission spectrum with a peak in the wavelength range from 500 nm to 630 nm, and the emission characteristics and the color rendering properties of the phosphor mixture thus manufactured were evaluated.

1) Preparation of Phosphor

By the method explained in the embodiments, 0.980/3 mol of $Ca_3N_2$, 1 mol of AlN, 1/3 mol of $Si_3N_4$, and 0.020/2 mol of $Eu_2O_3$ were prepared, and the raw materials thus prepared were mixed in a mortar after measurement, and the mixed raw materials were fired for 3 hours at 1600° C. in a nitrogen atmosphere of 0.05 MPa, followed by being crushed, and the red phosphor $CaAlSiN_3$:Eu was thereby manufactured.

In addition, the commercially available YAG:Ce was prepared as the phosphor having the emission spectrum with a peak in the wavelength range from 500 nm to 630 nm.

2) Adjustment of Phosphor Mixture

The emission spectra of the aforementioned two kinds of phosphors, $CaAlSiN_3$:Eu, YAG:Ce when excited by the excitation light having an emission spectrum with a peak at 470 nm, were respectively measured, and further, the emission spectrum of the excitation light (emission spectrum of the light emitting part) was measured, and from these emission spectra, a relative mixing ratio of each phosphor, by which the correlated color temperature of the phosphor mixture became 2800K, was obtained by simulation. Then, based on the result of the simulation, each phosphor was measured and mixed, and the phosphor mixture was thereby obtained. The mixing ratio of each phosphor was expressed by YAG:Ce:$CaAlSiN_3$:Eu=73.3:26.7.

Here, when excited by the excitation light having an emission spectrum with a peak at 470 nm, the half-value width of the emission spectrum of the $CaAlSiN_3$:Eu was 86.7 nm, and the half-value width of the emission spectrum of the YAG:Ce was 114.7 nm. Thus, all the half-value widths were 50 nm or more.

However, in some cases, a preferable mixing ratio is deviated from the simulation result, according to the emission wavelength of the light emitting part (excitation wavelength of the phosphor mixture) and the emission efficiency of the phosphor by the emission wavelength. In addition, in some cases, the preferable mixing ratio is also deviated from the simulation result according to the mixing ratio with resin, a coating method on the light emitting device, and a coating film thickness. In this case, the blending ratio of the phosphors is properly adjusted, to adjust the actual shape of the emission spectrum.

3) Evaluation of Emission Characteristics

When the phosphor mixture was irradiated with the light and the phosphor mixture had emission spectrum with a peak at 470 nm as the excitation light, and the correlated color temperature of the emission of the phosphor mixture was measured, it was 2813K. Therefore, it was found that the emission of the phosphor mixture had a target color temperature. Further, when the chromaticity of the emission spectrum was measured, it was expressed by x=0.451 and y=0.408. It was found that the emission spectrum had a continuous spectrum without a break in the wavelength range from 500 nm to 780 nm. The emission spectrum thus obtained is shown by a solid line in FIG. 1. Note that FIG. 1 is a graph showing the relative emission intensity in the ordinate, and the emission wavelength in the abscissa.

Then, the luminance of the emission thus obtained was measured based on the calculation method in the XYZ colorimetric system regulated by the JIS Z 8701, and when the relative luminance is defined as the luminance determined by standardizing the luminance according to an comparative example 1, as will be described later, set to be 100%, it was found that the above luminance was higher than that of the comparative example by 20%, having a sufficient luminance as the phosphor used for the LED illumination.

4) Evaluation of Color Rendering Properties

Pursuant to the JIS Z 8726, the evaluation of the color rendering properties in the emission of the phosphor mixture was performed. The general color rendering index Ra was 91, the special color rendering index R9 was 62, R10 was 94, R11 was 92, R12 was 74, R13 was 94, R14 was 90, and R15 was 87.

Measurement data of the embodiment 1 is described in table 1.

Embodiment 2

In the embodiment 2, the phosphor mixture having the emission spectrum which has the correlated color temperature of 2800K when excited by the light emitting element (LED) emitting the light having an emission spectrum with a peak at 470 nm was manufactured, by mixing the red phosphor $CaAlSiN_3$:Eu, the orange phosphor $CaAl_2Si_4N_8$:Eu, and the phosphor having the emission spectrum with a peak in the wavelength range from 500 nm to 630 nm, and the emission characteristics and the color rendering properties of the phosphor mixture thus manufactured were evaluated.

1) Preparation of Phosphor

In the same way as the embodiment 1, the red phosphor $CaAlSiN_3$:Eu was manufactured.

The material mixing composition ratio was prepared at 0.950/3 mol of $Ca_3N_2$, 2 mol of AlN, 4/3 mol of $Si_3N_4$, and 0.050/2 mol of $Eu_2O_3$, and the materials thus prepared were mixed in the mortar after measurement, and fired for 3 hours at 1700° C. in the nitrogen atmosphere of 0.05 MPa, and thereafter crushed, to thereby manufacture the orange phosphor $CaAl_2Si_4N_8$:Eu having the emission spectrum with a peak in the wavelength range from 500 nm to 630 nm.

In addition, the commercially available YAG:Ce was prepared as the phosphor having the emission spectrum with a peak in the wavelength range from 500 nm to 630 nm.

2) Adjustment of Phosphor Mixture

The emission spectra of the aforementioned three kinds of phosphors, $CaAlSiN_3$:Eu, the $CaAl_2Si_4N_8$:Eu, and the YAG:Ce when excited by the light having an emission spectrum with a peak at 470 nm, were respectively measured and further the emission spectrum of the excitation light (emission spectrum of the light emitting part) was measured. Then, from these emission spectra, the relative mixing ratio of each phosphor was obtained by simulation so that the correlated color temperature of the phosphor mixture was set to be 2800K. Based on the result of the simulation, each phosphor was measured and mixed, and the phosphor mixture was thereby obtained. The mixing ratio of each phosphor was expressed by YAG:Ce:$CaAl_2Si_4N_8$:Eu:$CaAlSiN_3$:Eu=71.0:12.2:16.8.

Here, when excited by the light having an emission spectrum with a peak at 470 nm, the half-value width of the emission spectrum of the $CaAlSiN_3$:Eu was 86.7 nm, the half-value width of the emission spectrum of the $CaAl_2Si_4N_8$:Eu was 85.2 nm, and the half-value width of the emission spectrum of the YAG:Ce was 114.7 nm. Thus, all the half-value widths were 50 nm or more.

3) Evaluation of Emission Characteristics

When the phosphor mixture thus obtained was irradiated with the light having emission spectrum with a peak at 470 nm as the excitation light, and the correlated color temperature of the emission of the phosphor mixture was measured, it was 2852K. Therefore, it was found that the emission of the phosphor mixture had a target color temperature. Further, when the chromaticity of the emission spectrum was measured, it was expressed by x=0.450 and y=0.412.

The emission spectrum had a continuous spectrum without a break in the wavelength range from 500 nm to 780 nm. The emission spectrum thus obtained is shown by one-dot chain line in FIG. 1.

Then, it was found that the luminance of the phosphor mixture thus obtained was higher than the luminance of the phosphor mixture according to the comparative example 1, as will be described later, by 19% in the relative luminance, and also found that the phosphor mixture thus obtained had a sufficient luminance as the phosphor used in the LED illumination.

4) Evaluation of Color Rendering Properties

Pursuant to the JIS Z 8726, the evaluation of the color rendering properties in the emission of the phosphor mixture was performed. The general color rendering index Ra was 95, the special color rendering index R9 was 98, R10 was 86, R11 was 92, R12 was 70, R12 was 70, R13 was 97, R14 was 93, and R15 was 97, all of which were 70 or more, particularly the R9 and the R15 were 90 or more, thus exhibiting a significant excellent color rendering properties.

The measurement data of the embodiment 2 is described in table 1.

COMPARATIVE EXAMPLE 1

In a comparative example 1, the phosphor mixture having the emission spectrum which has the correlated color temperature of 2800K when excited by the light emitting element (LED) was manufactured by mixing the red phosphor of the $CaSrSi_5N_8$:Eu described in the patent document 1, and the phosphor having the emission spectrum with a peak in the wavelength range from 500 nm to 630 nm, and the emission characteristics and the color rendering properties of the phosphor mixture were thereby evaluated.

1) Preparation of Phosphor

By the method explained in the embodiments, 0.975/3 mol Of $Ca_3N_2$, 0.975/3 mol of $Sr_3N_2$, 5/3 mol of $Si_3N_4$, and 0.050/2 mol of $Eu_2O_3$ were prepared, and the raw materials thus prepared were mixed in a mortar after measurement, and the mixed raw materials were fired for 3 hours at 1500° C. in the nitrogen atmosphere of 0.05 MPa, followed by being crushed to manufacture the red phosphor $CaSrSi_5N_8$:Eu.

In addition, the commercially available YAG:Ce was prepared as the phosphor having the emission spectrum with a peak in the wavelength range from 500 nm to 630 nm.

2) Adjustment of Phosphor Mixture

In the same way as the embodiment 1, the emission spectra of the aforementioned two kinds of phosphors, $CaSrSi_5N_8$:Eu and YAG:Ce when excited by the light having an emission spectrum with a peak at 470 nm, were respectively measured, and further, the emission spectrum of the excitation light was measured, and from these emission spectra, the relative mixing ratio of each phosphor was obtained by simulation, so that the correlated color temperature of the emission spectrum of the phosphor mixture was set to be 2800K. Then, based on the result of the simulation, each phosphor was measured and mixed, and the phosphor mixture was thereby obtained. The mixing ratio of each phosphor was expressed by YAG:Ce: $CaSrSi_5N_8$:Eu=68.0:32.0.

3) Evaluation of Emission Characteristics

When the phosphor mixture thus obtained was irradiated with the light having an emission spectrum with a peak at 470 nm as the excitation light, and the correlated color temperature of the emission of the phosphor mixture was measured, it was 2813K. Therefore, it was found that the emission of the phosphor mixture had a target color temperature. Further, when the chromaticity of the emission was measured, it was expressed by x=0.449 and y=0.410. The emission spectrum thus obtained is shown by a broken line in FIG. 1.

Then, as explained in the embodiment 1, the luminance of the emission of the phosphor mixture was obtained, which was then standardized and set to be 100% as the relative luminance. Then, it was found that the luminance thus measured was higher than that of the embodiment 1 by 20% or more, and lower than that of the embodiment 2 by 19%.

4) Evaluation of Color Rendering Properties

Pursuant to the JIS Z 8726, the evaluation of the color rendering properties in the emission of the phosphor mixture was performed. The general color rendering index Ra was 92, the special color rendering index R9 was 62, R10 was 87, R11 was 89, R12 was 70, R13 was 94, R14 was 96, and R15 was 90.

The measurement data of the comparative example 1 is described in the table 1.

Embodiment 3

In an embodiment 3, in the same way as the embodiment 2, the phosphor mixture emitting the light at the correlated color temperature of 2800K when excited by the light emitting element (LED) emitting the light at the wavelength of 470 nm, was manufactured by mixing the red phosphor $CaAlSiN_3$:Eu, the orange phosphor $CaAl_2Si_4N_8$:Eu, and the phosphor having the emission spectrum with a peak in the wavelength range from 500 nm to 630 nm. However, the kind of the phosphor having the emission spectrum with a peak in the range form 500 nm to 630 nm was changed.

1) Preparation of Phosphor

In the same way as the embodiments 1 and 2, the red phosphor $CaAlSiN_3$:Eu and the orange phosphor $CaAl_2Si_4N_8$:Eu were manufactured.

In addition, by the method explained in the embodiments, 0.975/3 mol of SrS, 1 mol of $Ga_2S_3$, and 0.025/2 mol of $Eu_2O_3$, were prepared, and the raw materials thus prepared were mixed in a mortar after measurement, and the mixed raw materials were fired for 3 hours at 1000° C. in the nitrogen atmosphere, followed by being crushed to manufacture the $SrGa_2S_4$:Eu.

2) Adjustment of Phosphor Mixture

In the same way as the embodiment 1, the emission spectra of the aforementioned phosphors when excited by the light having an emission spectrum with a peak at 470 nm, were respectively measured, and further, the emission spectrum of the excitation light was measured, and from these emission spectra, the relative mixing ratio of each phosphor was obtained by simulation, so that the correlated color temperature of the emission spectrum of the phosphor mixture was set to be 2800K. Then, based on the result of the simulation, each phosphor was measured and mixed, and the phosphor mixture was thereby obtained.

Here, the half-value width in the emission spectrum of the $SrGa_2S_4$:Eu when excited by the excitation light with wavelength of 470 nm was 51.5 nm.

3) Evaluation of Emission Characteristics

In the same way as the embodiment 1, when the phosphor mixture was irradiated with the light having an emission spectrum with a peak at 470 nm as the excitation light and the correlated color temperature of the emission of the phosphor mixture was measured, it was 2803K. Therefore, it was found that the emission of the phosphor mixture had a target color temperature. Further, when the chromaticity of the emission spectrum was measured, it was expressed by x=0.451 and y=0.408.

In the same way as the embodiment 1, the emission spectrum had a continuous spectrum without a break in the wavelength range from 500 nm to 780 nm, and had the emission spectrum with three peaks in the wavelength range from 500 nm to 780 nm.

TABLE 1

| | CHROMATICITY | | RELATIVE LUMINANCE | CORRELATED TEMPERATURE | COLOR RENDERING INDEX | | | | | | | |
|---|---|---|---|---|---|---|---|---|---|---|---|---|
| | x | y | (%) | Tcp(K) | Ra | R9 | R10 | R11 | R12 | R13 | R14 | R15 |
| EMBODIMENT 1 | 0.451 | 0.408 | 122 | 2813 | 91 | 62 | 94 | 92 | 74 | 94 | 90 | 87 |
| EMBODIMENT 2 | 0.450 | 0.412 | 119 | 2852 | 95 | 98 | 86 | 92 | 70 | 97 | 93 | 97 |
| COMPARATIVE EXAMPLE 1 | 0.499 | 0.410 | 100 | 2818 | 92 | 62 | 87 | 89 | 70 | 94 | 96 | 90 |

4) Evaluation of Color Rendering Properties

In the same way as the embodiment 1, the evaluation of the color rendering properties was performed. The general color rendering index Ra was 93, the special color rendering index R9 was 86, R10 was 81, R11 was 86, R12 was 62, R13 was 95, R14 was 91, and R15 was 96, all of which were 80 or more excepting R12. Particularly, the R9 and the R15 were 90 or more, thereby exerting significantly excellent color rendering properties.

The measurement data of the embodiment 3 was described in table 2.

Embodiment 4

In an embodiment 4 also, in the same way as the embodiment 2, the phosphor mixture emitting the light of the correlated color temperature of 2800K was adjusted, excepting that the kind of the phosphor having the emission spectrum with a peak in the wavelength range from 500 nm to 630 nm, was further changed.

1) Preparation of Phosphor

In the same way as the embodiments 1 and 2, the red phosphor $CaAlSiN_3$:Eu, and the orange phosphor $CaAl_2Si_4N_8$:Eu were manufactured.

In addition, by the method explained in the embodiments, 0.4875/2 mol of $SrCO_3$, 0.4875/2 mol of $BaCO_3$, 1/2 mol of $Si_3N_4$, and 1/2 mol of $SiO_2$ and 0.025/2 mol of $Eu_2O_3$ were prepared, and the raw materials thus prepared were mixed in the mortar after measurement, and the mixed raw materials were fired for 3 hours at 1500° C. in a nitrogen atmosphere of 0.05 MPa, followed by being crushed to manufacture (Sr, Ba)$Si_2O_2N_2$:Eu.

2) Adjustment of Phosphor Mixture

In the same way as the embodiment 1, the emission spectra of the aforementioned phosphors, when excited by the light having an emission spectrum with a peak at 470 nm, were measured, further the emission spectrum of the aforementioned excitation light was measured, and the relative mixing ratio of each phosphor was obtained by simulation, so that the correlated color temperature of the phosphor mixture was set to be 2800K. Based on the result, each phosphor was measured and mixed, and the phosphor mixture was thereby obtained.

Here, the half-value width in the emission spectrum of the (Sr, Ba)$Si_2O_2N_2$:Eu was 98.7 nm, when excited by the excitation light having an emission spectrum with a peak at 470 nm.

3) Evaluation of Emission Characteristics

In the same way as the embodiment 1, when the correlated color temperature of the emission of the phosphor mixture was measured, it was 2803K. Therefore, it was found that the emission of the phosphor mixture had a target color temperature. Further, when the chromaticity of the emission was measured, it was expressed by x=0.451, and y=0.408.

In the same way as the embodiment 1, the emission spectrum had a continuous spectrum without a break in the wavelength range from 500 nm to 780 nm, and had the emission spectrum with three peaks in the wavelength range from 500 nm to 780 nm.

4) Evaluation of Color Rendering Properties

In the same way as the embodiment 1, the evaluation of the color rendering properties was performed. The general color rendering index Ra was 94, the special color rendering index R9 was 88, R10 was 88, R11 was 88, R12 was 70, R13 was 95, R14 was 95, and R15 was 95, all of which were 80 or more excepting the R12. Particularly, the R9 and the R15 were 90 or more, thereby exerting the significantly excellent color rendering properties.

The measurement data of the embodiment 4 was described in table 2.

TABLE 2

| | CHROMATICITY | | CORRELATED TEMPERATURE | COLOR RENDERING INDEX | | | | | | | |
|---|---|---|---|---|---|---|---|---|---|---|---|
| | x | y | Tcp(K) | Ra | R9 | R10 | R11 | R12 | R13 | R14 | R15 |
| EMBODIMENT 3 | 0.451 | 0.408 | 2803 | 93 | 86 | 81 | 86 | 62 | 95 | 91 | 96 |
| EMBODIMENT 4 | 0.451 | 0.408 | 2803 | 94 | 88 | 88 | 88 | 70 | 95 | 95 | 95 |

Embodiment 5

In an embodiment 5, the phosphor mixture was manufactured by mixing the red phosphor $CaAlSiN_3$:Eu, the orange phosphor $CaAl_2Si_4N_8$:Eu which were used in the embodiment 2, and the YAG:Ce as the phosphor having the emission spectrum with a peak in the wavelength range from 500 nm to 630 nm, the phosphor mixture having the emission spectrum which has the correlated color temperature of 4200k was manufactured, and the emission characteristics and the color rendering properties of the phosphor mixture were evaluated.

1) Preparation of Phosphor

In the same way as the embodiment 2, the $CaAlSiN_3$:Eu and the $CaAl_2Si_4N_8$:Eu were manufactured and the YAG:Ce was prepared.

2) Adjustment of Phosphor Mixture

In the same way as the embodiment 1, the light emitting spectra when excited by the excitation light having an emission spectrum with a peak at 470 nm were respectively measured, further the emission spectrum of the excitation light was measured, and from these emission spectra, the relative mixing ratio of each phosphor was obtained by simulation, so that the correlated color temperature of the phosphor mixture was set to be 4200K. Based on the result, each phosphor was measured and mixed, and the phosphor mixture was thereby obtained.

3) Evaluation of Emission Characteristics

In the same way as the embodiment 1, when the correlated color temperature of the emission of the phosphor mixture was measure, it was 4199K. Therefore, it was found that the emission of the phosphor mixture had a target color temperature. Further, when the chromaticity of the emission spectrum was measured, it was expressed by x=0.374, and y=0.378.

Figure 2:
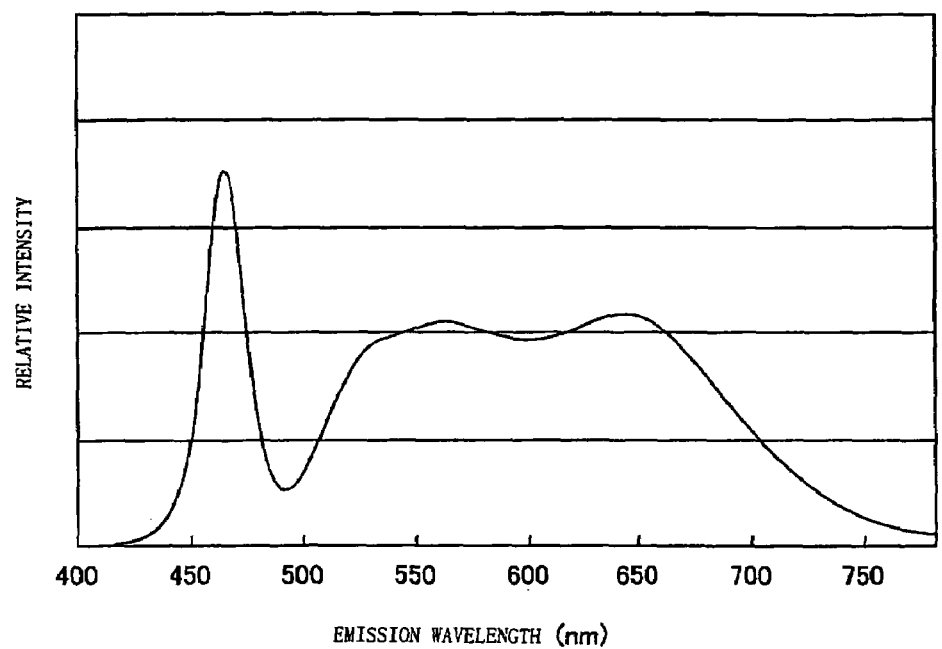
FIG. 2 shows an emission spectrum of a phosphor mixture according to the embodiment, having the correlated color temperature of 4200K.

The emission spectrum thus obtained was shown by a solid line in FIG. 2. Note that in the same way as FIG. 1, FIG. 2 is a graph showing the relative emission intensity in the ordinate, and the emission wavelength in the abscissa.

In the same way as the embodiment 1, the emission spectrum had a continuous spectrum without a break in the wavelength range from 500 nm to 780 nm.

4) Evaluation of Color Rendering Properties

In the same way as the embodiment 1, the evaluation of the color rendering properties was performed. The general color rendering index Ra was 92, the special color rendering index R9 was 97, R10 was 86, R11 was 84, R12 was 55, R13 was 96, R14 was 95, and R15 was 92, all of which were 80 or more excepting the R12. Particularly, the R9 and the R15 were 90 or more, thereby exerting the significant excellent color rendering properties.

The measurement data of the embodiment 5 was described in table 3.

Embodiment 6

In the embodiment 6, the phosphor mixture was manufactured by mixing the red phosphor $CaAlSiN_3$:Eu, the orange phosphor $CaAl_2Si_4N_8$:Eu, and the $SrGa_2S_4$:Eu as the phosphor having the emission spectrum with a peak in the wavelength range from 500 nm to 630 nm, which were used in the embodiment 3, the phosphor mixture emitting the light having the correlated color temperature of 4200K was manufactured, and the emission characteristics and the color rendering properties of the phosphor mixture were evaluated.

1) Preparation of Phosphor

In the same way as the embodiment 3, three kinds of phosphors of the $CaAlSiN_3$:Eu, $CaAl_2Si_4N_8$:Eu, and $SrGa_2S_4$:Eu were manufactured.

2) Adjustment of Phosphor Mixture

In the same way as the embodiment 1, the emission spectra of the aforementioned three kinds of phosphors, when excited by the excitation light having an emission spectrum with a peak at 470 nm, were respectively measured, and further, the emission spectrum of the excitation light was measured, and from these emission spectra, the relative mixing ratio of each phosphor was obtained by simulation, so that the correlated color temperature of the phosphor mixture was set to be 4200K. Then, based on the result of the simulation, each phosphor was measured and mixed, and the phosphor mixture was thereby obtained.

3) Evaluation of Emission Characteristics

In the same way as the embodiment 1, when the correlated color temperature of the emission of the phosphor mixture was measured, it was 4207K. Therefore, it was found that the emission of the phosphor mixture had a target color temperature. Further, when the chromaticity of the emission spectrum was measured, it was expressed by x=0.373 and y=0.378.

In the same way as the embodiment 1, the emission spectrum had a continuous spectrum without a break in the wavelength range from 500 nm to 780 nm.

4) Evaluation of Color Rendering Properties

In the same way as the embodiment 2, the evaluation of the color rendering properties was performed. The general color rendering index Ra was 91, the special color rendering index R9 was 92, R10 was 80, R11 was 83, R12 was 50, R13 was 97, R14 was 90, and R15 was 92, all of which were 80 or more excepting the R12. Particularly, the R9 and the R15 were 90 or more, thus exerting the significantly excellent color rendering properties.

The measurement data of the embodiment 7 is described in table 3.

Embodiment 7

In the embodiment 7, the phosphor mixture was manufactured by mixing the red phosphor $CaAlSiN_3$:Eu, the orange phosphor $CaAl_2Si_4N_8$:Eu, and the $(Sr, Ba) Si_2O_2N_2$:Eu as the phosphor having the emission spectrum with a peak in the wavelength range from 500 nm to 630 nm, which were used in the embodiment 4, and the emission characteristics and the color rendering properties of the phosphor mixture were evaluated.

2) Adjustment of Phosphor Mixture

In the same way as the embodiment 1, the emission spectra of the aforementioned phosphors, when excited by the light having an emission spectrum with a peak at 470 nm, were respectively measured, further the emission spectrum of the excitation light was measured, and from these emission spectra, the relative mixing ratio of each phosphor was obtained, by simulation, so that the correlated color temperature of the emission spectrum of the phosphor mixture was set to be 4200K. Based on the result, each phosphor was measured and mixed, and the phosphor mixture was thereby obtained.

3) Evaluation of Emission Characteristics

In the same way as the embodiment 1, when the correlated color temperature of the emission of the phosphor mixture was measured, it was 4196K. Therefore, it was found that the emission of the phosphor mixture had a target color temperature. Further, when the chromaticity of the emission spectrum was measured, it was expressed by x=0.374 and y=0.379.

In the same way as the embodiment 1, the emission spectrum had a continuous spectrum without a break in the wavelength range from 500 nm to 780 nm.

4) Evaluation of Color Rendering Properties

In the same way as the embodiment 1, the evaluation of the color rendering properties was performed. The general color rendering index Ra was 91, the special color rendering index R9 was 92, R10 was 86, R11 was 81, R12 was 55, R13 was 94, R14 was 95, and R15 was 92, all of which were 80 or more excepting the R12. Particularly, the R9 and the R15 were 90 or more, thus exerting the significantly excellent color rendering properties.

The measurement data of the embodiment 6 is described in table 3.

TABLE 3

| | CHROMATICITY | | CORRELATED TEMPERATURE | COLOR RENDERING INDEX | | | | | | | |
|---|---|---|---|---|---|---|---|---|---|---|---|
| | x | y | Tcp(K) | Ra | R9 | R10 | R11 | R12 | R13 | R14 | R15 |
| EMBODIMENT 5 | 0.374 | 0.378 | 4199 | 92 | 97 | 86 | 84 | 55 | 96 | 95 | 92 |
| EMBODIMENT 6 | 0.373 | 0.378 | 4207 | 91 | 92 | 80 | 83 | 50 | 97 | 90 | 92 |
| EMBODIMENT 7 | 0.374 | 0.379 | 4196 | 91 | 92 | 86 | 81 | 55 | 94 | 95 | 92 |

What is claimed is
1. A phosphor mixture, comprising:
a red phosphor expressed by a composition formula MmAaBbOoNn:Z (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by m=a=b=1, o<0.5, n=3-2/3 o.), and more than one kind of phosphor having an emission spectrum with a peak in the wavelength range from 500 nm to 630 nm.

2. The phosphor mixture according to claim 1, wherein one kind of the phosphor having the emission spectrum with a peak in the wavelength range from 500 nm to 630 nm is expressed by the composition formula MmAaBbOoNn:Z (wherein element M is more than one kind of element having bivalent valency, element A is the more than one kind of element having tervalent valency, element B is more than one kind of element having tetravalent valency, O is oxygen, N is nitrogen, element Z is the element acting as an activator in the phosphor, expressed by n=2/3m+a+4/3b-2/3o, m>0, a≧0, b>0, o≧0).

3. The phosphor mixture according to claim 1, wherein one kind of the phosphor having the emission spectrum with a peak in the wavelength range from 500 nm to 630 nm is expressed by the composition formula MmAaBbOoNn:Z (wherein element M is more than one kind of element having bivalent valency, element A is more than one kind of element having tervalent valency, element B is more than one kind of element having tetravalent valency, O is oxygen, N is nitrogen, element Z is the element acting as an activator in the phosphor, expressed by m=1.0, a=2.0, 3.0≦b≦6.0, o<1.0, n=8/3+4/3b-2/3o).

4. The phosphor mixture according to claim 1, wherein the element M is more than one kind of element selected from a group consisting of Ca, Mg, Sr, Ba, and Zn, the element A is more than one kind of element selected from the group consisting of Al and Ga, the element B is more than one kind of element selected from the group consisting of Si and Ge, and the element Z is more than one kind of element selected from rare earth elements and transition metal elements.

5. The phosphor mixture according to claim 1, wherein the element Z is Eu.

6. The phosphor mixture according to claim 1, wherein each of the phosphors has an emission spectrum of 50 nm or more in half-value width.

7. The phosphor mixture according to claim 1 having a continuous emission spectrum which has a correlated color temperature of 7000K to 2000K and has not a break in the wavelength range from 500 nm to 780 nm, when excited by excitation light having an emission spectrum in the wavelength range from 430 nm to 500 nm.

8. The phosphor mixture according to claim 1, having a continuous emission spectrum which has a correlated color temperature from 4500K to 2000K and has two or more emission peaks in the wavelength range from 500 nm to 780 nm, when excited by an excitation light having an emission spectrum in the wavelength range from 430 nm to 500 nm.

9. The phosphor mixture according to claim 1, having the emission spectrum of which the chromaticity satisfies x>0.2, y>0.2 when excited by the excitation light having an emission spectrum in the wavelength range from 430 nm to 500 nm.

10. The phosphor mixture according to claim 1, wherein each phosphor comprises particles having an average particle diameter of 0.1 to 20 μm.

11. A light emitting device having the phosphor mixture according to claim 1, and a light emitting part having an emission spectrum with a peak in the wavelength range from 430 nm to 500 nm.

12. The light emitting device according to claim 11, wherein general color rendering index Ra of the light emitting device is set at not less than 80.

13. The light emitting device according to claim 11, emitting the light of which special color rendering index R9 is set at not less than 60.

14. The light emitting device according to claim 11, emitting the light of which special color rendering index R15 is set at not less than 80.

15. The light emitting device according to claim 11, emitting the light which has a correlated color temperature from 7000K to 2500K.

16. The light emitting device according to claim 11, emitting the light which has a correlated color temperature from 4500K to 2500K.

17. The light emitting device according to claim 11, having the light of which the chromaticity satisfies x>0.3, y>0.3.

18. The light emitting device according to claim 11, wherein the light emitting part is an light emitting diode (LED).

19. The light emitting device according to claim 18, wherein the light emitting part is the light emitting diode (LED) formed of a material containing Ga.

* * * * *